Oct. 29, 1963 C. P. BOWNE 3,108,560

MEANS FOR ASSEMBLING PRINTED CIRCUITS WITH COMPONENTS

Filed July 15, 1959 2 Sheets-Sheet 1

INVENTOR.
Charles P. Bowne
BY
Robert E. Fowler
ATTORNEY

Oct. 29, 1963 C. P. BOWNE 3,108,560

MEANS FOR ASSEMBLING PRINTED CIRCUITS WITH COMPONENTS

Filed July 15, 1959 2 Sheets-Sheet 2

INVENTOR.
Charles P. Bowne

BY

Robert C. Fowler

ATTORNEY

United States Patent Office 3,108,560
Patented Oct. 29, 1963

3,108,560

MEANS FOR ASSEMBLING PRINTED CIRCUITS WITH COMPONENTS

Charles P. Bowne, Kokomo, Ind., assignor to General Motors Corporation, Detroit, Mich., a corporation of Delaware Filed July 15, 1959, Ser. No. 827,288
4 Claims. (Cl. 113—95)

This invention relates to a method and means for automatically fabricating electrical subassemblies that utilize printed circuit boards to increase production.

Printed circuit boards are today in common use in electrical and electronic equipment and are used both to mechanically support components used in the apparatus and electrically connect the same together. Usually the various subassemblies are put together first and then those are assembled on a main frame or a housing to complete the product. To use assembly line techniques, a printed circuit board having the proper configuration of conductors on its face may be placed on a conveyor and started along a given path and as it progresses, the various components, such as conductors, resistors, sockets, etc. are placed upon the board at progressive stations at the correct location on the board and with leads projecting through proper openings in the board. By the time the board reaches a given point all of the necessary components have been mechanically assembled on the board but at this point no electrical connections have been made except where two conducting surfaces mechanically touch. It is next necessary to solder the electrical joints and then the subassembly will be complete.

It is an object in making this invention to provide a method and means for automatically covering with flux all of the joints between the components on the printed circuit board and the circuit preparatory to soldering.

It is a further object in making this invention to provide a method and means for automatically applying flux to a surface of a printed circuit board prior to dip soldering on subassembly fabrication.

It is a still further object in making this invention to provide a method and means for automatically fabricating and soldering a printed circuit subassembly.

With these and other objects in view which will become apparent as the specification proceeds, the invention will be best understood by reference to the following specification and claims and the illustrations of the accompanying drawings in which:

Figure 1:
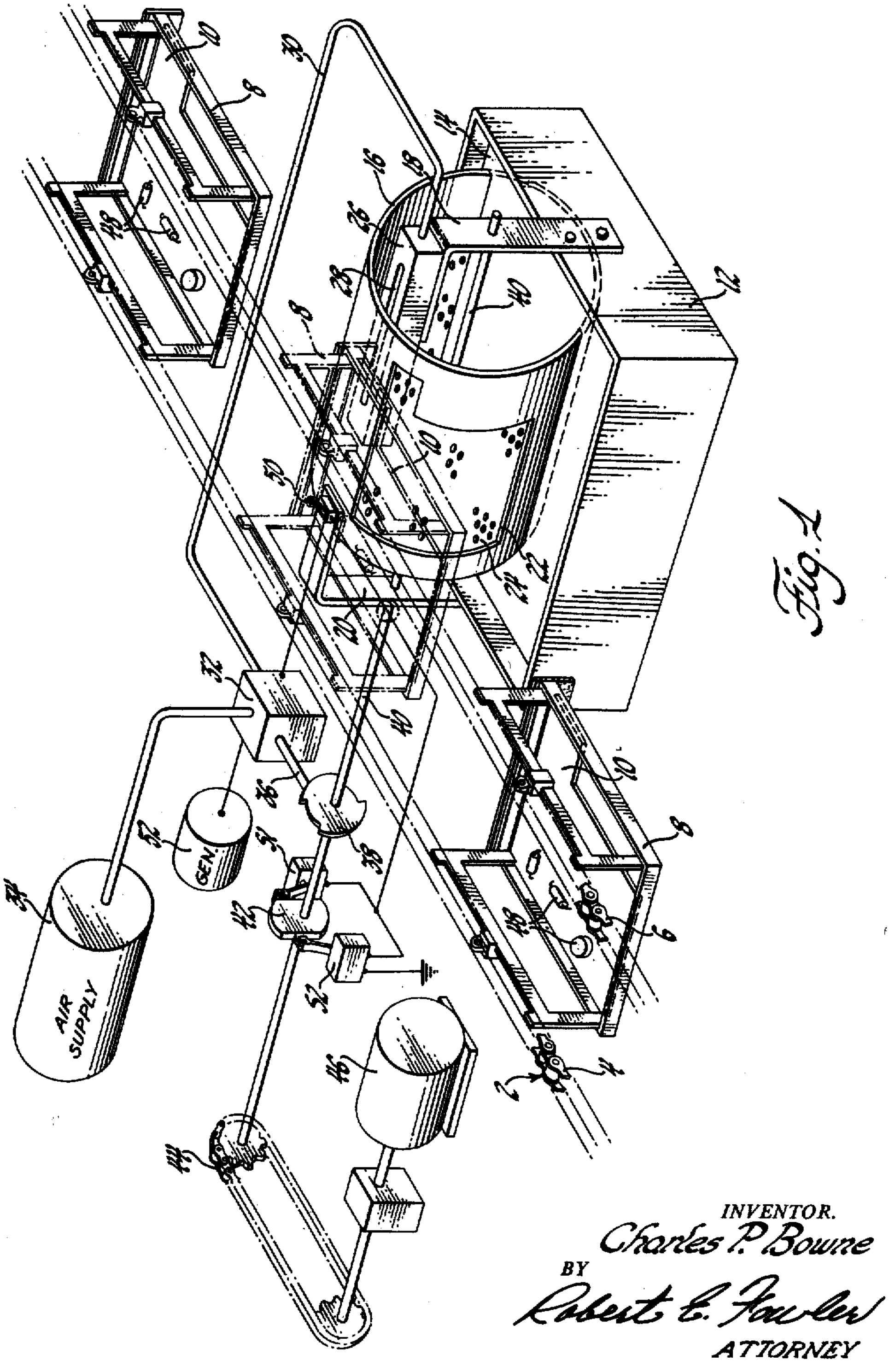
FIGURE 1 is a perspective, schematic view of a portion of a system for automatically applying flux to a printed circuit subassembly as it passes a given station embodying my invention.
Figure 2:
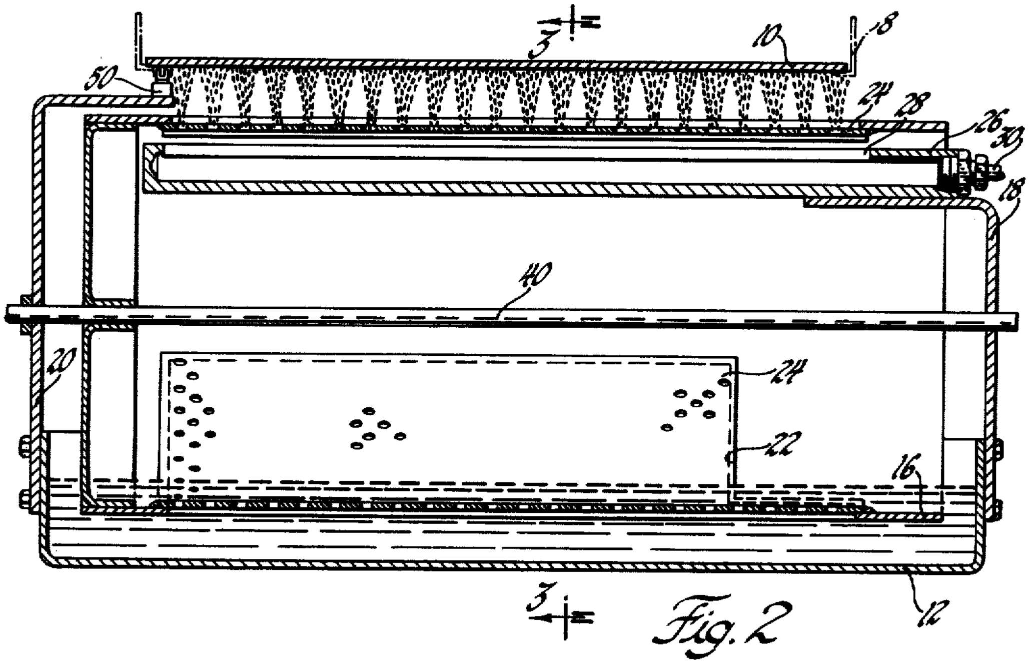
FIGURE 2 is an enlarged sectional view through the flux applying apparatus; and, FIGURE 3 is a sectional view taken on the line 3—3 of FIG. 2.
Figure 3:
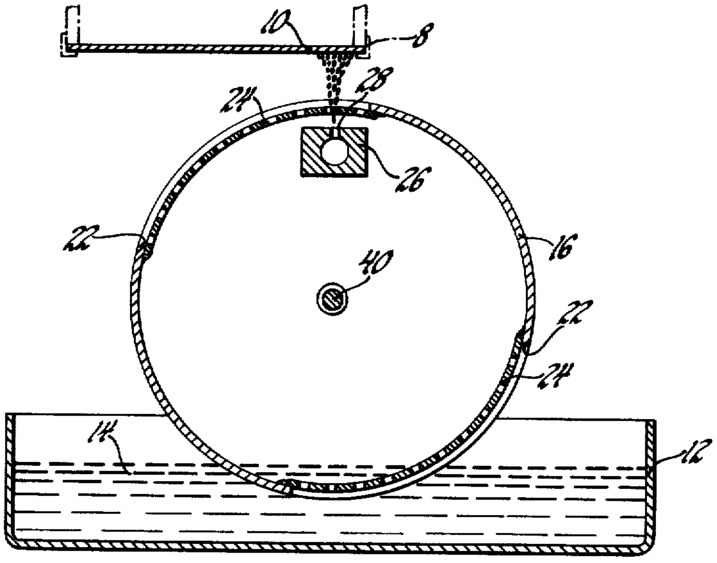

Referring now more particularly to FIGURE 1, there is shown therein conveyor means identified generally at 2 which may consist, for example, of chains 4 and 6 driven along a certain path upon which are supported carriers 8 which individually support printed circuit boards 10 along the assembly line. As mentioned previously at earlier stages in the assembly components are mounted upon the boards as they pass certain stations and it is assumed that by the time that they arrive at the fluxing station all of these components, such for example as 48, will have been assembled and the board is ready for soldering. The boards may be of varying configuration depending upon the main apparatus with which they are to be assembled and in the present instance the board 10 has been illustrated as having an L-shape. Upon arrival at the fluxing station it is desired to apply flux to the lower surface of the board through which the leads of the various components project and upon which certain conductors have been printed for connection.

The means for applying said flux to the lower surface automatically can be described generally as a tank 12 containing a supply of liquid flux 14 up to a predetermined level. A large rotary drum 16 is mounted for rotation on end brackets 18 and 20. This drum is so mounted that its periphery rotates down into the flux at the lower portion and sections thereof may pick up the flux as it rotates. The drum may be formed of any solid material, either metallic or plastic, and has in its surface a series of openings 22, the configuration of which corresponds to the shape of the printed circuit boards which it is desired to spray with flux. Screening 24 is mounted in each of the openings 22. Thus as the drum rotates down into the flux the screen will pick up the flux in the interstices and hold it as the drum rotates upward. When the screen reaches an upper position upon drum rotation it is so designed as to align exactly with one of the printed circuit board assemblies. At that point compressed air is blown through the screen to carry the droplets of flux up to the under surface of the printed circuit board.

This portion of the apparatus is shown as an elongated nozzle 26 having a slot 28 in its surface which slot extends across the drum and as the screening comes over the slot the air forces the droplets of flux up to the under surface of the board. The drum is so designed that the screen areas are the proper distance apart as compared with the distance between the carriers 8 on the conveyor so that the screen areas come up under each printed circuit board. Compressed air is conducted to the nozzle 26 through piping 30 connected back to a control valve 32. The control valve 32 is directly connected to an air supply 34 and is operated by a plunger 36 riding on a cam 38. The cam 38 is mounted directly on shaft 40 which carries the drum 16. A second cam 42 is also mounted upon the shaft 40 which operates two electrical switches $S_1$ and $S_2$ connected in an electrical control series circuit for the air valve which includes a switch so mounted on an extension of arm 18 which is open when there is no board on the one of the conveyor carriers in alignment with the down screen. Thus even though the carrier arrives at the fluxing point the flux will not be blown upwardly unless there is a board present to receive the same. These switches are in a series circuit between a source of power 52, control valve 32 and ground. The shaft 40 is driven through any suitable drive such as a chain drive 44 from a motor 46.

Summarizing the operation, the printed circuit boards are first placed in a carriage 8 as they proceed along the path of assembly. Components 48 are mechanically mounted thereon at the various stations until all have been added. Upon arrival at the fluxing station the carriage 8 bearing the assembled printed board 10 rides over the tank 12 and as the forward edge reaches the center of the drum switch 50 is closed to condition the control circuit and the cam 38 actuates the valve switch to apply air pressure through the nozzle opening 28 to blow the flux from the screen 24 onto the lower surface of the board. This assumes that switches $S_1$ or $S_2$ are also closed. As the carriage proceeds past this point the drum will rotate and the various sections of the screen 24 in that area will have the flux removed by the air stream and applied to the bottom part of the printed circuit board of the same configuration. If no printed board is present then even though switches $S_1$ and $S_2$ are closed by cam 42 further safety switch 50 will be open which will prevent actuation of the air valve 32 so that the flux will not needlessly be blown from the screen. As one board passes switch 50 will open and also rod 36 will move back to cut off the air pressure.

The carriage 8 now passes on to the next station where it dips the printed circuit board into a solder bath to solder the desired connections.

What is claimed is:

1. Means for applying flux to one surface of a printed circuit board having a predetermined conductive circuit configuration thereon as it moves along an assembly line including a bath of flux, a drum rotatably supported above the bath of flux so that its periphery dips down into the same, said drum having a plurality of openings in its surface of the shape of the conductive circuit configuration of the printed circuit boards, screen closure members mounted in each opening in the drum so that as the drum rotates the screen members will be submerged in the flux and filled with the same when they rise out of the flux bath, said drum being so mounted that its upper surface is adjacent the assembly line along which the printed circuit boards move and the screen closure members sequentially aligned with consecutive printed circuit boards as they move along, hollow nozzle means mounted within said drum and adjacent the upper surface to apply air under pressure through the screen closure members, a source of air under pressure, valve means connected between the source of air and the nozzle means to control the flow of air to the nozzle means and synchronizing control means connected to the valve means outlined to open the same when a printed circuit board is in alignment with one of the flux laden screen closure members.

2. In fluxing apparatus for assembly line operation, a conveyor carrying a plurality of printed circuit board assemblies in horizontal position which boards have applied conductive circuit configuration to one surface which it is desired to coat with flux for soldering purposes, a drum rotatably mounted with its axis at right angles to that of the conveyor, said drum having opening in its surface of the same configuration as that of the surface of the conductive circuit portion of the printed circuit boards which it is desired to flux, screen closure members mounted in each opening, a flux bath supported below the drum into which the lower edge submerges as the drum rotates to fill the screen closure members with the flux, a source of air under pressure, and air nozzle means connected to said source of air pressure and mounted within the drum to blow the flux out of the screen closure mesh and on to the lower surface of each board as the screen member reaches the top position in proximity to the lower surface of the passing printed circuit board.

3. In fluxing apparatus for assembly line operation, a conveyor carrying a plurality of printed circuit board assemblies in horizontal position which boards have applied conductive circuit configuration to one surface which it is desired to coat with flux for soldering purposes, a drum rotatably mounted with its axis at right angles to that of the conveyor, said drum having openings in its surface of the same configuration as that of the surface of the conductive circuit portion of the printed circuit boards which it is desired to flux, screen closure members mounted in each opening, a flux bath supported below the drum into which the lower edge submerges as the drum rotates to fill the screen members with the flux as they move therethrough, a source of air under pressure, air nozzle means connected to said source of air pressure and mounted within the drum to blow the flux out of the screen mesh and on to the lower surface of the board when the screen closure member reaches the top position in proximity to the lower surface of the passing printed circuit board, and synchronized control means connected to the air nozzle means and to the source of air pressure to apply the air pressure thereto when each printed circuit board reaches a point over the top of the drum in alignment with one of the screen members.

4. In fluxing apparatus for assembly line operation, a conveyor carrying a plurality of printed circuit board assemblies in horizontal position which boards have applied conductive circuit configurations to one surface which it is desired to coat with flux for soldering purposes, a drum rotatably mounted with its axis at right angles to that of the conveyor, said drum having openings in its surface of the same configuration as that of the conducting circuit portion of the surface of the printed circuit boards which it is desired to flux, screen closure members mounted in each opening, a flux bath supported below the drum into which the lower edge submerges as the drum rotates to fill the screen closure members with the flux as they move therethrough, a source of air under pressure, air nozzle means connected to said source of air pressure and mounted within the drum to blow the flux out of the screen mesh after they have moved out of the flux and on to the lower surface of the board when the screen closure member reaches the top position in proximity to the lower surface of the passing printed circuit boards, synchronized control means connected to the air nozzle means and to the source of air under pressure to apply the air pressure thereto when the printed circuit board reaches a point over the top of the drum, and interlock switching means connected to the synchronized control means to prevent the application of air to the air nozzle means if the drum reaches the correct position but no printed circuit board is present in alignment therewith to receive the flux.

References Cited in the file of this patent

UNITED STATES PATENTS

| | | |
|---|---|---|
| 581,294 | Lorillard | Apr. 27, 1897 |
| 1,887,416 | Matlack | Nov. 8, 1932 |
| 2,213,108 | Pollard | Aug. 27, 1940 |
| 2,386,813 | O'Brien et al. | Oct. 16, 1945 |
| 2,502,291 | Taylor | Mar. 28, 1950 |
| 2,515,097 | Schryber | July 11, 1950 |
| 2,660,113 | Gullixson et al. | Nov. 24, 1953 |
| 2,683,839 | Beck | July 13, 1954 |
| 2,751,874 | Gedde | June 26, 1956 |
| 2,756,497 | Gale | July 31, 1956 |
| 2,777,419 | Paasche | Jan. 15, 1957 |
| 2,792,780 | Jacob | May 21, 1957 |
| 2,832,633 | Meier | Feb. 18, 1958 |

OTHER REFERENCES

Electrical Manufacturing, July 1953, pp. 101–108.

UNITED STATES PATENT OFFICE

CERTIFICATE OF CORRECTION

Patent No. 3,108,560 October 29, 1963

Charles P. Bowne

It is hereby certified that error appears in the above numbered patent requiring correction and that the said Letters Patent should read as corrected below.

Column 3, line 16, after "screen" insert -- closure --; line 28, for "outlined" read -- and timed --; line 37, for "opening" read -- openings --; line 39, strike out "conductive circuit portion of the" and insert the same after "the", second occurrence, in line 38, same column 3; same column 3, line 54, for "configuration" read -- configurations --; column 4, line 21, for "conducting" read -- conductive --.

Signed and sealed this 29th day of December 1964.

(SEAL)
Attest:

ERNEST W. SWIDER
Attesting Officer

EDWARD J. BRENNER
Commissioner of Patents